US012633956B2

(12) United States Patent
Miura et al.

(10) Patent No.: US 12,633,956 B2
(45) Date of Patent: May 19, 2026

(54) HIGH-FREQUENCY MODULE AND COMMUNICATION DEVICE

(71) Applicant: Murata Manufacturing Co., Ltd., Nagaokakyo (JP)

(72) Inventors: Masanari Miura, Nagaokakyo (JP); Kiyoshi Aikawa, Nagaokakyo (JP); Hiroyuki Nagamori, Nagaokakyo (JP); Takanori Uejima, Nagaokakyo (JP); Yuji Takematsu, Nagaokakyo (JP); Takahiro Yamashita, Nagaokakyo (JP); Ryo Wakabayashi, Nagaokakyo (JP); Yoshihiro Yoshimura, Nagaokakyo (JP); Takashi Hirose, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 297 days.

(21) Appl. No.: 18/342,743

(22) Filed: Jun. 28, 2023

(65) Prior Publication Data

US 2023/0344460 A1     Oct. 26, 2023

Related U.S. Application Data

(63) Continuation of application No. PCT/JP2021/039861, filed on Oct. 28, 2021.

(30) Foreign Application Priority Data

Dec. 28, 2020     (JP) ................................. 2020-218425

(51) Int. Cl.
    *H04B 1/40*          (2015.01)
    *H05K 1/181*         (2026.01)
    (Continued)

(52) U.S. Cl.
    CPC ............... *H04B 1/40* (2013.01); *H05K 1/181* (2013.01); *H05K 9/0022* (2013.01);
    (Continued)

(58) Field of Classification Search
    CPC ............. H01L 23/3121; H01L 23/5383; H01L 23/552; H01L 23/66; H01L 25/0652;
    (Continued)

(56) References Cited

U.S. PATENT DOCUMENTS

2011/0304993 A1* 12/2011 Takemura ........... H01L 23/3121
                                                          361/736
2012/0025356 A1   2/2012 Liao et al.
                  (Continued)

FOREIGN PATENT DOCUMENTS

WO     2007/114224 A1   10/2007
WO     2019/049647 A1   3/2019
              (Continued)

OTHER PUBLICATIONS

International Search Report and Written Opinion mailed on Jan. 18, 2022, received for PCT Application PCT/JP2021/039861, filed on Oct. 28, 2021, 10 pages including English Translation.

*Primary Examiner* — Nguyen T Vo
(74) *Attorney, Agent, or Firm* — XSENSUS LLP

(57)               ABSTRACT

A high-frequency module is capable of two-uplink of a transmission signal in Band A and transmission of Band C, and includes a module substrate, a metal shield plate arranged on a principal surface, power amplifiers, a transmission filter of Band A, and a transmission filter of Band C. In a plan view, the metal shield plate is arranged between a first transmission component and a second transmission component. The first transmission component is one of the power amplifier, the transmission filter, a switch circuit, and a first inductor and a first capacitor arranged in a first (Continued)

transmission path, and the second transmission component is one of the power amplifier, the transmission filter, a switch circuit, and a second inductor and a second capacitor arranged in a second transmission path.

16 Claims, 9 Drawing Sheets

(51) Int. Cl.
    *H05K 9/00*         (2006.01)
    *H10W 42/20*      (2026.01)
    *H10W 90/00*      (2026.01)
(52) U.S. Cl.
    CPC ........... *H10W 42/20* (2026.01); *H10W 90/00* (2026.01); *H05K 2201/10015* (2013.01); *H05K 2201/1003* (2013.01); *H05K 2201/10053* (2013.01); *H05K 2201/1006* (2013.01); *H05K 2201/10371* (2013.01)
(58) Field of Classification Search
    CPC ......... H01L 25/16; H04B 1/00; H04B 1/0057; H04B 1/006; H04B 1/04; H04B 1/38; H04B 1/40; H05K 1/0219; H05K 1/023; H05K 1/115; H05K 1/181; H05K 2201/09609; H05K 2201/10015; H05K 2201/1003; H05K 2201/10053; H05K 2201/1006; H05K 2201/10371; H05K 2201/10378; H05K 9/0022; H05K 9/0024
    See application file for complete search history.

(56) References Cited

U.S. PATENT DOCUMENTS

2020/0204144 A1*  6/2020  Matsumoto .......... H04B 1/0458
2020/0366323 A1* 11/2020  Tsuda ................... H04B 1/0078
2020/0395972 A1* 12/2020  Matsumoto ........... H04B 1/401

FOREIGN PATENT DOCUMENTS

WO      2019/151528 A1    8/2019
WO      2019/244816 A1   12/2019

* cited by examiner

HIGH-FREQUENCY MODULE AND COMMUNICATION DEVICE

CROSS-REFERENCE TO RELATED APPLICATIONS

This application is a continuation application of PCT International Application No. PCT/JP2021/039861 filed on Oct. 28, 2021, designating the United States of America, which is based on and claims priority to Japanese Patent Application No. 2020-218425 filed on Dec. 28, 2020. The entire disclosures of the above-identified applications, including the specifications, drawings and claims are incorporated herein by reference in their entirety.

TECHNICAL FIELD

The present disclosure relates to a high-frequency module and a communication device.

BACKGROUND ART

Patent Document 1 discloses a high-frequency front-end module including a first multiplexer and a second multiplexer, a first switch circuit arranged between a primary antenna and a secondary antenna and the first multiplexer and the second multiplexer, a first amplifier connected to the first multiplexer, and a second amplifier 42 connected to the second multiplexer. The first switch circuit exclusively switches connection between the primary antenna and the first multiplexer and connection between the primary antenna and the second multiplexer, and exclusively switches connection between the secondary antenna and the first multiplexer and connection between the secondary antenna and the second multiplexer. Accordingly, two-uplink two-downlink can be realized while reducing the number of filters.

CITATION LIST

Patent Document

Patent Document 1: International Publication No. 2019/151528

SUMMARY OF DISCLOSURE

Technical Problem

However, when a circuit component constituting the high-frequency front-end module disclosed in Patent Document 1 is mounted on a module substrate, a first transmission component arranged on a first transmission path connecting a first amplifier and the first multiplexer and a second transmission component arranged on a second transmission path connecting a second amplifier and the second multiplexer may interfere with each other during two-uplink, resulting in insufficient isolation between the first transmission path and the second transmission path.

The present disclosure has been made to solve the above-described problem, and an object of the present disclosure is to provide a high-frequency module and a communication device in which isolation between two transmission paths during two-uplink is improved.

Solution to Problem

According to an aspect of the present disclosure, there is provided a high-frequency module capable of performing two-uplink for simultaneously transmitting a signal in a first transmission band included in a first frequency band and a signal in a second transmission band included in a second frequency band different from the first frequency band, the high-frequency module including: a module substrate having a first principal surface and a second principal surface facing each other; a first ground metal member arranged on the first principal surface; a first power amplifier and a second power amplifier; a first transmission filter connected to the first power amplifier and including the first transmission band in a pass band; and a second transmission filter connected to the second power amplifier and including the second transmission band in a pass band in which, when the module substrate is viewed in a plan view, the first ground metal member is arranged between a first transmission component arranged on the first principal surface and a second transmission component arranged on the first principal surface, the first transmission component is one of (1) the first power amplifier, (2) the first transmission filter, (3) a first switch configured to switch connection and disconnection between the first power amplifier and the first transmission filter, (4) a first inductor connected to one of the first power amplifier, the first transmission filter, and the first switch, and (5) a first capacitor connected to one of the first power amplifier, the first transmission filter, and the first switch, and the second transmission component is one of (1) the second power amplifier, (2) the second transmission filter, (3) a second switch configured to switch connection and disconnection between the second power amplifier and the second transmission filter, (4) a second inductor connected to one of the second power amplifier, the second transmission filter, and the second switch, and (5) a second capacitor connected to one of the second power amplifier, the second transmission filter, and the second switch.

Advantageous Effects of Disclosure

According to the present disclosure, it is possible to provide a high-frequency module and a communication device in which isolation between two transmission paths during two-uplink is improved.

DESCRIPTION OF EMBODIMENTS

Figure 1:
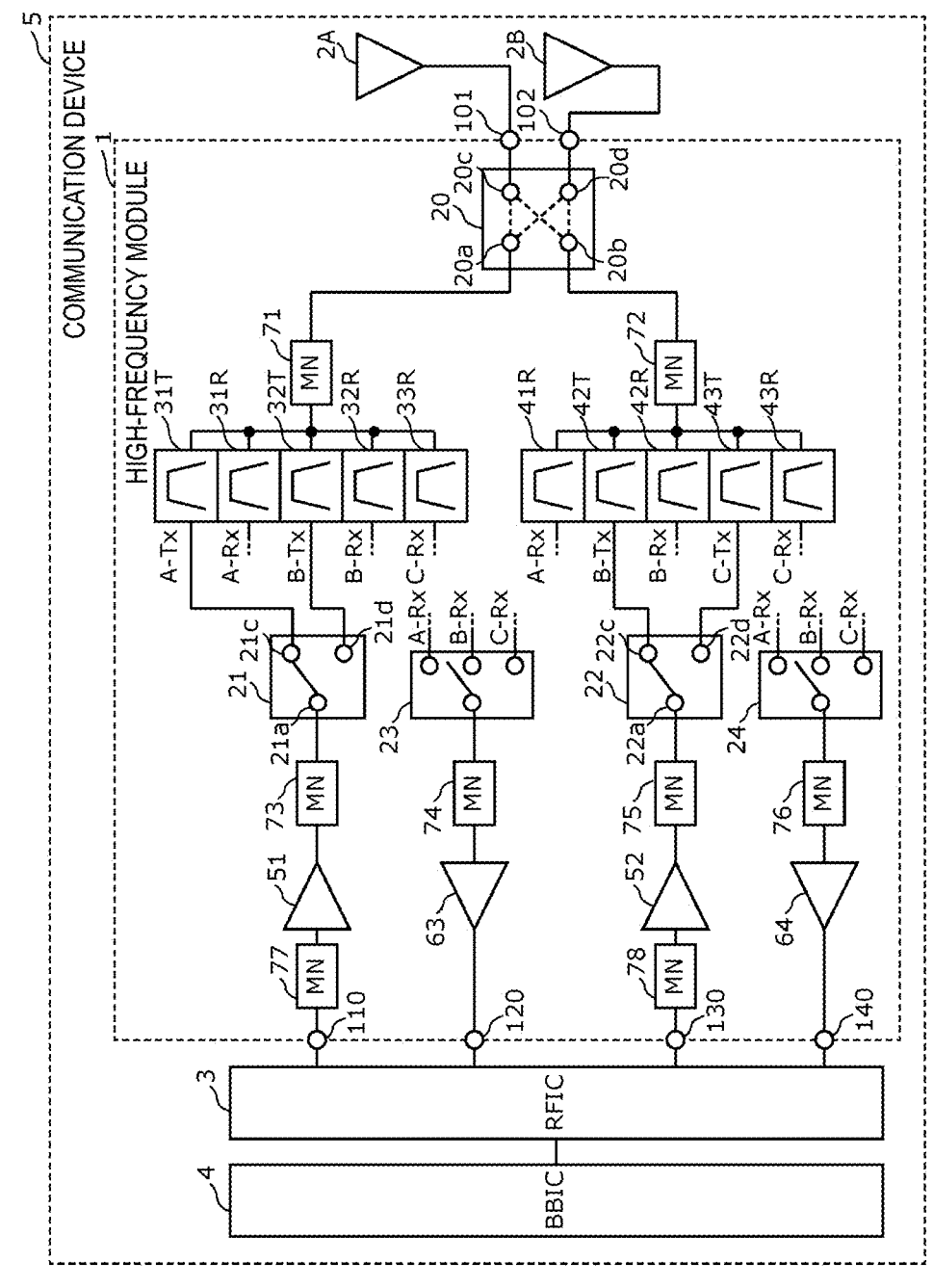
FIG. 1 is a circuit configuration diagram of a high-frequency module and a communication device according to an embodiment.

Hereinafter, an embodiment of the present disclosure will be described in detail. Note that the embodiment to be described below represents a comprehensive or specific example. Numerical values, shapes, materials, constituent elements, arrangements and connection forms of the constituent elements, and the like described in the following embodiment are mere examples and are not intended to limit the present disclosure. Among the constituent elements in the following examples and modification, constituent elements not recited in the independent claims are described as optional constituent elements. In addition, sizes or size ratios of the constituent elements illustrated in the accompanying drawings are not necessarily precise. In each of the accompanying drawings, for the substantially same configurations, the same reference signs are denoted, and redundant description may be omitted or simplified.

In addition, in the following description, a term representing a relationship between elements such as parallel and perpendicular, a term representing a shape of an element such as a rectangular shape and the like, and a numerical range represent not only a strict meaning but also mean that a substantially equivalent range, for example, a difference of approximately several % is included.

Further, in the following embodiment, "A is arranged on a first principal surface of a substrate" means not only that A is directly mounted on the first principal surface, but also that A is arranged in a space on a first principal surface side, of the space on the first principal surface side and a space on a second principal surface side, separated by the substrate. That is, a case where A may be mounted on the first principal surface with other circuit elements, electrodes, and the like interposed therebetween is included.

In addition, in the following embodiment, "A and B are connected to each other" means not only that A and B contact with each other but is defined to include a case where A and B are electrically connected to each other with a conductor electrode, a conductor terminal, a wiring line, another circuit component, or the like interposed therebetween. In addition, "connected between A and B" means being connected to both A and B between A and B.

In addition, in the following embodiment, "A and B are bonded to each other" means a state where A and B are mechanically (physically) bonded to each other and is particularly defined to include a case where one surface included in A and one surface included in B are bonded to each other.

In each of the following drawings, an x-axis and a y-axis are axes orthogonal to each other on a plane parallel to a principal surface of a module substrate. In addition, a z-axis is an axis perpendicular to the principal surface of the module substrate, and a positive direction thereof indicates an upward direction and a negative direction thereof indicates a downward direction.

In addition, in a module configuration of the present disclosure, a "plan view" means that an object is viewed from a z-axis positive side by orthographic projection onto an xy plane. "A component is arranged on a principal surface of a substrate" includes not only a case where the component is arranged on the principal surface in a state of being in contact with the principal surface of the substrate, but also a case where the component is arranged above the principal surface without being in contact with the principal surface and a case where a part of the component is arranged to be embedded in the substrate from a principal surface side.

Hereinafter, in the following, in A, B, and C mounted on a substrate, "C is arranged between A and B in a plan view of the substrate (or a principal surface of the substrate)" means that at least one line segment of a plurality of line segments connecting an arbitrary point in A to an arbitrary point in B in a plan view of the substrate passes through a region of C. Further, a plan view of the substrate means that the substrate and a circuit element mounted on the substrate are viewed by orthographic projection onto a plane parallel to the principal surface of the substrate.

In addition, in the following, a "transmission path" means a transmission line configured with a wiring line through which a high-frequency transmission signal propagates, an electrode directly connected to the wiring line, a terminal directly connected to the wiring line or the electrode, and the like. In addition, a "reception path" means a transmission line configured with a wiring line through which a high-frequency reception signal propagates, an electrode directly connected to the wiring line, a terminal directly connected to the wiring line or the electrode, and the like.

Embodiment

1. Configuration of High-Frequency Module 1 and Communication Device 5

FIG. 1 is a circuit configuration diagram of a high-frequency module 1 and a communication device 5 according to an embodiment. As illustrated in FIG. 1, the communication device 5 includes the high-frequency module 1, antennas 2A and 2B, an RF signal processing circuit (RFIC) 3, and a baseband signal processing circuit (BBIC) 4.

The antenna 2A is, for example, a primary antenna, and is an antenna used in preference to the antenna 2B in terms of antenna performances and the like, and is an antenna element capable of transmitting and receiving signals in Bands A, B, and C. In addition, the antenna 2B is, for example, a secondary antenna, and is an antenna element capable of transmitting and receiving signals in Bands A, B, and C.

The RFIC 3 is the RF signal processing circuit that processes high-frequency signals transmitted and received by the antennas 2A and 2B. The RFIC 3 performs a signal processing of a reception signal inputted via the high-frequency module 1 by down-conversion or the like, and outputs the reception signal generated by the signal processing to the BBIC 4. In addition, the RFIC 3 performs a signal processing of a transmission signal inputted from the BBIC 4 by up-conversion or the like, and outputs the transmission signal generated by the signal processing to a transmission path of the high-frequency module 1.

The BBIC 4 is a circuit that performs a signal processing using an intermediate-frequency band having a lower frequency than a high-frequency signal propagating through the high-frequency module 1. The signal processed in the BBIC 4 is used, for example, as an image signal for image display or as an audio signal for a call via a speaker.

In addition, the RFIC 3 also has a function as a control unit that controls connection of a switch circuit (to be described later) included in the high-frequency module 1 based on a band (frequency band) to be used. The RFIC 3 switches connection of the switch circuit included in the high-frequency module 1 by a control signal (not illustrated). Note that the control unit may be provided outside the RFIC 3, for example, in the high-frequency module 1 or in the BBIC 4.

Next, a detailed circuit configuration of the high-frequency module 1 will be described.

As illustrated in FIG. 1, the high-frequency module 1 includes switch circuits 20, 21, 22, 23, and 24, transmission filters 31T, 32T, 42T, and 43T, reception filters 31R, 32R, 33R, 41R, 42R, and 43R, power amplifiers 51 and 52, low noise amplifiers 63 and 64, and matching circuits 71, 72, 73, 74, 75, 76, 77, and 78.

According to the above-described configuration, the high-frequency module 1 can perform two-uplink for simultaneously transmitting two signals among signals in a first transmission band (A-Tx) included in a first frequency band (Band A), signals in a second transmission band (C-Tx) included in a second frequency band (Band C) different from the first frequency band, and signals in a third transmission band (B-Tx) included in a third frequency band (Band B) different from the first frequency band and the second frequency band, and can perform two-downlink for simultaneously receiving two signals among signals in a first reception band (A-Rx) included in the first frequency band (Band A), signals in a second reception band (C-Rx) included in the second frequency band (Band C), and signals in a third reception band (B-Rx) included in the third frequency band (Band B) different from the first frequency band and the second frequency band.

The transmission filter 31T is an example of a first transmission filter which takes A-Tx as a pass band, an input terminal is connected to a selection terminal 21c, and an output terminal is connected to the switch circuit 20 with the matching circuit 71 interposed therebetween.

The transmission filter 32T is an example of a fifth transmission filter which takes B-Tx as a pass band, an input terminal is connected to a selection terminal 21d, and an output terminal is connected to the switch circuit 20 with the matching circuit 71 interposed therebetween.

The reception filter 31R is an example of a first reception filter which takes A-Rx as a pass band, an input terminal is connected to the switch circuit 20 with the matching circuit 71 interposed therebetween, and an output terminal is connected to the switch circuit 23.

The reception filter 32R is an example of a fifth reception filter which takes B-Rx as a pass band, an input terminal is connected to the switch circuit 20 with the matching circuit 71 interposed therebetween, and an output terminal is connected to the switch circuit 23.

The reception filter 33R is an example of a fourth reception filter which takes C-Rx as a pass band, an input terminal is connected to the switch circuit 20 with the matching circuit 71 interposed therebetween, and an output terminal is connected to the switch circuit 23.

The transmission filter 42T is an example of a sixth transmission filter which takes B-Tx as a pass band, an input terminal is connected to a selection terminal 22c, and an output terminal is connected the switch circuit 20 with the matching circuit 72 interposed therebetween.

The transmission filter 43T is an example of a second transmission filter which takes C-Tx as a pass band, an input terminal is connected to a selection terminal 22d, and an output terminal is connected the switch circuit 20 with the matching circuit 72 interposed therebetween.

The reception filter 41R is an example of a third reception filter which takes A-Rx as a pass band, an input terminal is connected to the switch circuit 20 with the matching circuit 72 interposed therebetween, and an output terminal is connected to the switch circuit 24.

The reception filter 42R is an example of a sixth reception filter which takes B-Rx as a pass band, an input terminal is connected to the switch circuit 20 with the matching circuit 72 interposed therebetween, and an output terminal is connected to the switch circuit 24.

The reception filter 43R is an example of a second reception filter which takes C-Rx as a pass band, an input terminal is connected to the switch circuit 20 with the matching circuit 72 interposed therebetween, and an output terminal is connected to the switch circuit 24.

The transmission filters 31T and 32T and the reception filters 31R, 32R and 33R constitute a first multiplexer capable of selectively transmitting high-frequency signals in Bands A and B and receiving high-frequency signals in Bands A, B and C. Note that the first multiplexer does not have a transmission filter which takes C-Tx as a pass band.

The transmission filters 42T and 43T and the reception filters 41R, 42R and 43R constitute a second multiplexer capable of selectively transmitting high-frequency signals in Bands B and C and receiving high-frequency signals in Bands A, B and C. Note that the second multiplexer does not have a transmission filter which takes A-Tx as a pass band.

The power amplifier 51 is an example of a first power amplifier, an input terminal is connected to a transmission input terminal 110 with the matching circuit 77 interposed therebetween, and an output terminal is connected to the switch circuit 21 with the matching circuit 73 interposed therebetween. The power amplifier 52 is an example of a second power amplifier, an input terminal is connected to a transmission input terminal 130 with the matching circuit 78 interposed therebetween, and an output terminal is connected to the switch circuit 22 with the matching circuit 75 interposed therebetween. The power amplifiers 51 and 52 are, for example, power amplifiers constituted by transistors or the like.

The switch circuit 20 is an example of a third switch and includes a terminal 20a (a first terminal), a terminal 20b (a second terminal), a terminal 20c (a first antenna connection terminal), and a terminal 20d (a second antenna connection terminal).

The terminal 20c is connected to the antenna 2A with a transmission/reception terminal 101 interposed therebetween, and the terminal 20d is connected to the antenna 2B with a transmission/reception terminal 102 interposed therebetween. In addition, the terminal 20a is connected to a common terminal of the first multiplexer with the matching circuit 71 interposed therebetween, and the terminal 20b is connected to a common terminal of the second multiplexer with the matching circuit 72 interposed therebetween.

In the switch circuit 20, conduction between the terminal 20a and the terminal 20c, and conduction between the terminal 20a and the terminal 20d are exclusively selected, and conduction between the terminal 20b and the terminal 20c, and conduction between the terminal 20b and the terminal 20d are exclusively selected.

The switch circuit 20 is, for example, a double pole double throw (DPDT) type switch circuit having terminals 20a, 20b, 20c, and 20d. Note that, the switch circuit 20 may be a switch circuit such as a double pole 3 throw (DP3T) type or a double pole 4 throw (DP4T) type. In this case, necessary terminals may be used in accordance with the number of bands to be used.

The switch circuit 21 is an example of a first switch that switches connection and disconnection between the power amplifier 51 and the transmission filter 31T. The switch circuit 21 is a single pole double throw (SPDT) type switch circuit having a common terminal 21a, and selection terminals 21c and 21d. The common terminal 21a is connected to the output terminal of the power amplifier 51 with the matching circuit 73 interposed therebetween. The switch circuit 22 is an example of a second switch that switches connection and disconnection between the power amplifier 52 and the transmission filter 43T. The switch circuit 22 is an SPDT type switch circuit having a common terminal 22a, and selection terminals 22c and 22d. The common terminal 22a is connected to the output terminal of the power amplifier 52 with the matching circuit 75 interposed therebetween.

The switch circuit 23 is a single pole 3 throw (SP3T) type switch circuit having a common terminal and three selection terminals. The common terminal of the switch circuit 23 is connected to an input terminal of the low noise amplifier 63 with the matching circuit 74 interposed therebetween. The switch circuit 24 is the SP3T type switch circuit having a common terminal and three selection terminals. The common terminal of the switch circuit 24 is connected to an input terminal of the low noise amplifier 64 with the matching circuit 76 interposed therebetween.

The matching circuit 71 is arranged on a path connecting the switch circuit 20 and the first multiplexer and performs impedance matching between the switch circuit 20 and the first multiplexer. The matching circuit 72 is arranged on a path connecting the switch circuit 20 and the second multiplexer and performs impedance matching between the switch circuit 20 and the second multiplexer. The matching circuit 73 is arranged on a path connecting the switch circuit 21 and the power amplifier 51 and performs impedance matching between the switch circuit 21 and the power amplifier 51. The matching circuit 74 is arranged on a path connecting the switch circuit 23 and the low noise amplifier 63 and performs impedance matching between the switch circuit 23 and the low noise amplifier 63. The matching circuit 75 is arranged on a path connecting the switch circuit 22 and the power amplifier 52 and performs impedance matching between the switch circuit 22 and the power amplifier 52. The matching circuit 76 is arranged on a path connecting the switch circuit 24 and the low noise amplifier 64 and performs impedance matching between the switch circuit 24 and the low noise amplifier 64. The matching circuit 77 is arranged on a path connecting the transmission input terminal 110 and the power amplifier 51 and performs impedance matching between the RFIC 3 and the power amplifier 51. The matching circuit 78 is arranged on a path connecting the transmission input terminal 130 and the power amplifier 52 and performs impedance matching between the RFIC 3 and the power amplifier 52. Note that each of the matching circuits 71 to 78 may include at least one inductor or at least one capacitor.

Because the high-frequency module 1 includes the switch circuits 20 to 24, the first multiplexer, and the second multiplexer, the high-frequency module 1 can optionally distribute the high-frequency signals in Bands A, B, and C to the antennas 2A and 2B by switching the connection states of the switch circuits 20 to 24 and can perform two-uplink simultaneous transmission and two-uplink two-downlink simultaneous transmission. Here, the transmission filter of Band C can be reduced in the first multiplexer, and the transmission filter of Band A can be reduced in the second multiplexer. Therefore, it is possible to provide a small-sized high-frequency module 1 capable of two-uplink simultaneous transmission and two-downlink simultaneous transmission.

Note that, in the present specification, the first multiplexer and the second multiplexer are defined to include a duplexer in which an output terminal of the transmission filter and an input terminal of the reception filter are commonly connected by the switch circuit 20 as in the present embodiment.

In addition, according to the above-described configuration, the high-frequency module 1 can perform so-called one-uplink two-downlink simultaneous transmission in which only one of the high-frequency signals in Bands A, B, and C is transmitted and the high-frequency signals in Bands A, B, and C are simultaneously received.

Note that the high-frequency module according to the present disclosure may include at least the power amplifiers 51 and 52 and the transmission filters 31T and 43T among circuit components illustrated in FIG. 1.

For example, the high-frequency module 1 may include the following configuration as the first multiplexer and the second multiplexer. That is, the first multiplexer may have the transmission filter 31T and the reception filter 31R and does not have to have the transmission filter 32T, the reception filters 32R and 33R, and the transmission filter which takes C-Tx as a pass band. In addition, the second multiplexer may have the transmission filter 43T and the reception filter 43R and does not have to have the transmission filter 42T, the reception filters 41R and 42R, and the transmission filter which takes A-Tx as a pass band.

Accordingly, because the switch circuit 20, the first multiplexer, and the second multiplexer are provided, the high-frequency signals in Bands A and C can be optionally distributed to the antennas 2A and 2B by switching the connection state of the switch circuit 20, and two-uplink simultaneous transmission, and two-uplink two-downlink simultaneous transmission can be performed. Here, because the first multiplexer does not have the transmission filter and the reception filter of Band C and the second multiplexer does not have the transmission filter and the reception filter of Band A, it is possible to provide the small-sized high-frequency module 1 capable of two-uplink two-downlink simultaneous transmission.

Further, for example, the high-frequency module 1 may include the following configuration as the first multiplexer and the second multiplexer. That is, the first multiplexer may have the transmission filter 31T, the reception filters 31R and 33R, and does not have to have the transmission filter 32T, the reception filter 33R, and a transmission filter which takes C-Tx as a pass band. In addition, the second multiplexer may have the transmission filter 43T, the reception filters 41R and 43R, and does not have to have the transmission filter 42T, the reception filter 42R, and a transmission filter which takes A-Tx as a pass band.

Accordingly, because the switch circuit 20, the first multiplexer, and the second multiplexer are provided, the high-frequency signals in Bands A and C can be optionally distributed to the antennas 2A and 2B by switching the connection state of the switch circuit 20, and two-uplink simultaneous transmission, and two-uplink two-downlink simultaneous transmission can be performed. Here, because the first multiplexer does not have a transmission filter of Band C and the second multiplexer does not have a transmission filter of Band A, it is possible to provide the small-sized high-frequency module 1 capable of two-uplink two-downlink simultaneous transmission.

Note that, a path connecting the transmission input terminal 110, the matching circuit 77, the power amplifier 51, the matching circuit 73, the switch circuit 21, the transmission filter 31T, and the matching circuit 71 is defined as a first transmission path for transmitting a transmission signal in Band A. In addition, a path connecting the transmission input terminal 130, the matching circuit 78, the power amplifier 52, the matching circuit 75, the switch circuit 22, the transmission filter 43T, and the matching circuit 72 is defined as a second transmission path for transmitting a transmission signal in Band C.

Here, when the circuit components constituting the high-frequency module 1 illustrated in FIG. 1 are mounted on a module substrate, for example, a first transmission component arranged on the first transmission path and a second transmission component arranged on the second transmission path may interfere with each other during two-uplink of the transmission signal in Band A and the transmission signal in Band C, and isolation between the first transmission path and the second transmission path may become insufficient.

Hereinafter, in the high-frequency module 1 according to the present embodiment, a configuration in which mutual interference between the first transmission component and the second transmission component is suppressed during two-uplink will be described.

2. Circuit Component Arrangement Configuration of High-Frequency Module 1A According to Example 1

Figure 2A:
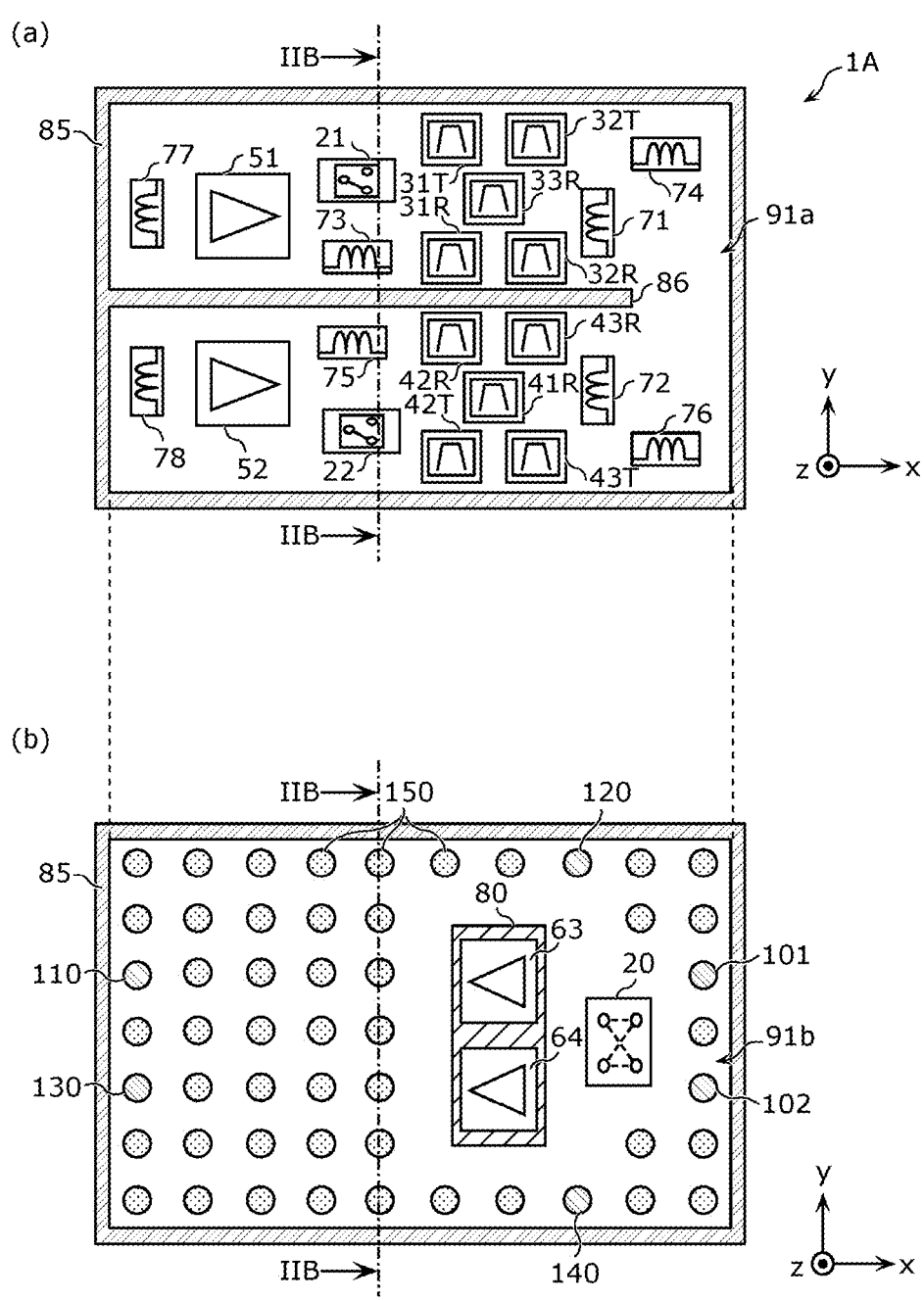
FIG. 2A is a plan view of a high-frequency module according to Example 1.
Figure 2B:
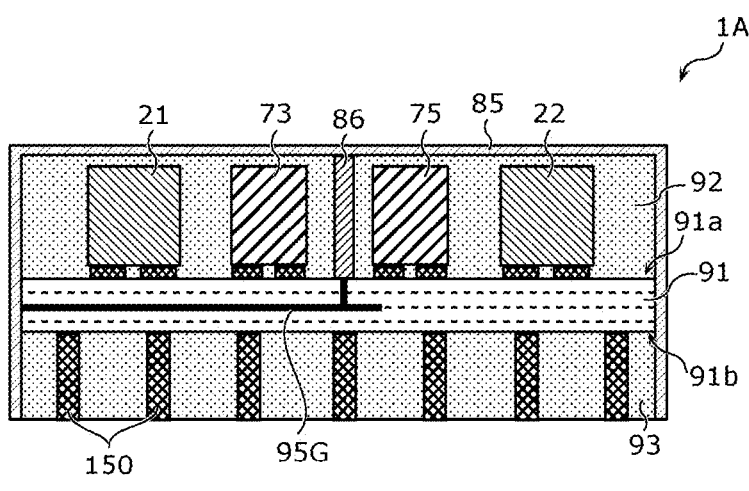
FIG. 2B is a sectional view of the high-frequency module according to Example 1.

FIG. 2A is a plan view of a high-frequency module 1A according to Example 1. In addition, FIG. 2B is a sectional view of the high-frequency module 1A according to Example 1, that is taken along a line IIB-IIB in FIG. 2A. Note that, in (a) of FIG. 2A, a layout diagram of circuit components is illustrated when a principal surface 91a, of the principal surface 91a and a principal surface 91b of a module substrate 91 facing each other, is viewed from a z-axis positive direction side. On the other hand, in (b) of FIG. 2A, a perspective view of the arrangement of the circuit components is illustrated when the principal surface 91b is viewed from the z-axis positive direction side. In addition, in FIG. 2A, each circuit component is provided with a mark indicating a function thereof so that the arrangement relationship of the circuit components can be easily perceived, but the mark is not provided in the actual high-frequency module 1A.

The high-frequency module 1A according to Example 1 specifically represents the arrangement configuration of the circuit elements constituting the high-frequency module 1 according to the embodiment.

As illustrated in FIG. 2A and FIG. 2B, the high-frequency module 1A according to the present example further includes the module substrate 91, resin members 92 and 93, external connection terminals 150, a metal shield layer 85, and a metal shield plate 86, in addition to the circuit configuration illustrated in FIG. 1.

The module substrate 91 has the principal surface 91a and the principal surface 91b facing each other and is the substrate on which the circuit components constituting the high-frequency module 1A are mounted. As the module substrate 91, for example, a low temperature co-fired ceramics (LTCC) substrate having a laminated structure of a plurality of dielectric layers, a high temperature co-fired ceramics (HTCC) substrate, a component built-in substrate, a substrate including a redistribution layer (RDL), a printed circuit board, or the like is used.

Note that, in the present example, the principal surface 91a corresponds to a first principal surface, and the principal surface 91b corresponds to a second principal surface.

Note that, as illustrated in (b) of FIG. 2A, the transmission/reception terminals 101 and 102, the transmission input terminals 110 and 130, and reception output terminals 120 and 140 may be formed on the principal surface 91b.

The resin member 92 is arranged on the principal surface 91a and covers a part of the circuit components constituting the high-frequency module 1A and the principal surface 91a. The resin member 93 is arranged on the principal surface 91b and covers a part of the circuit components constituting the high-frequency module 1A and the principal surface 91b. The resin members 92 and 93 have a function to ensure reliability such as mechanical strength and moisture resistance of the circuit components constituting the high-frequency module 1A. Note that the resin members 92 and 93 are not essential constituent elements of the high-frequency module 1 according to the present embodiment.

The metal shield layer 85 is formed on a surface of the resin member 92 and is set to a ground potential. The metal shield layer 85 is, for example, a metal thin film formed by a sputtering method, and is copper, an alloy containing copper, or a multilayer body containing copper. Note that the metal shield layer 85 is not an essential constituent element of the high-frequency module 1 according to the present embodiment.

As illustrated in FIGS. 2A and 2B, in the high-frequency module 1A according to the present example, the power amplifiers 51 and 52, the first multiplexer, the second multiplexer, the switch circuits 21 and 22, and the matching circuits 71 to 78 are arranged on the principal surface 91a. On the other hand, the low noise amplifiers 63 and 64 and the switch circuit 20 are arranged on the principal surface 91b.

Note that, in the present example, each of the matching circuits 71 to 78 includes at least one inductor or at least one capacitor.

Further, although not illustrated in FIG. 2A, wiring lines connecting the circuit components illustrated in FIG. 1 are formed inside the module substrate 91 and on the principal surfaces 91a and 91b. In addition, the above wiring lines may be bonding wires whose both ends are bonded to any one of the principal surfaces 91a, 91b and the circuit components constituting the high-frequency module 1A, or may be terminals, electrodes, or wiring lines formed on surfaces of the circuit components constituting the high-frequency module 1A.

The external connection terminals 150 are arranged on the principal surface 91b of the module substrate 91. The high-frequency module 1A exchanges electric signals with an external substrate arranged on a z-axis negative direction side of the high-frequency module 1A via the plurality of external connection terminals 150. In addition, some of the plurality of external connection terminals 150 are set to a ground potential of the external substrate. Of the principal surfaces 91a and 91b, on the principal surface 91b facing the external substrate, the circuit components that are difficult to reduce in height are not arranged, and the low noise amplifiers 63 and 64 and the switch circuit 20 that are easy to reduce in height are arranged.

Note that the external connection terminals 150 may be columnar electrodes penetrating the resin member 93 in a z-axis direction as illustrated in FIGS. 2A and 2B, or the external connection terminals 150 may be bump electrodes formed on the principal surface 91b. In this case, the resin member 93 on the principal surface 91b may be omitted.

In addition, because the power amplifiers 51 and 52, and the low noise amplifiers 63 and 64 are distributed on both sides across the module substrate 91, isolation between transmission and reception can be improved.

Further, the low noise amplifiers 63 and 64 may be included in one semiconductor IC 80. According to this, the high-frequency module 1A can be reduced in size and height. Further, the semiconductor IC 80 may include the switch circuit 20.

The metal shield plate 86 is an example of a first ground metal member and is a metal wall body erected from the principal surface 91a toward a top surface of the resin member 92 in the z-axis positive direction side. The metal shield plate 86 is bonded to a ground electrode on the principal surface 91a and the metal shield layer 85. In other words, because the metal shield plate 86 is connected to the ground at least two locations above and below the metal shield plate 86, an electromagnetic field shielding function is enhanced. Note that, the metal shield plate 86 may be in contact with a shield surface of the metal shield layer 85 that is in contact with the top surface of the resin member 92 of the shield surfaces constituting the metal shield layer 85, or may be in contact with a shield surface of the metal shield layer 85 that is in contact with a side surface of the resin member 92 of the shield surfaces constituting the metal shield layer 85. In addition, the metal shield plate 86 may be connected to a ground electrode layer 95G formed in the module substrate 91. A detailed structure of the metal shield plate 86 will be described later with reference to FIGS. 3A to 3C.

As illustrated in (a) of FIG. 2A, when the module substrate 91 is viewed in a plan view, the metal shield plate 86 is arranged between the power amplifier 51, the transmission filter 31T, the switch circuit 21, and the matching circuits 71, 73, and 77 and the power amplifier 52, the transmission filter 43T, the switch circuit 22, and the matching circuits 72, 75, and 78.

Here, each of the power amplifier 51, the transmission filter 31T, the switch circuit 21, and the matching circuits 71, 73, and 77 is the first transmission component arranged on the first transmission path that transmits a transmission signal in Band A. In addition, each of the power amplifier 52, the transmission filter 43T, the switch circuit 22, and the matching circuits 72, 75, and 78 is the second transmission component arranged on the second transmission path that transmits a transmission signal in Band C.

According to the configuration described above, by strengthening the electromagnetic field shielding function by the metal shield plate 86, mutual interference between the first transmission component and the second transmission component during two-uplink of the transmission signal in Band A and the transmission signal in Band C can be suppressed. Thus, it is possible to provide the high-frequency module 1A in which the isolation between the first transmission path and the second transmission path is improved.

In the high-frequency module 1A according to the present example, the metal shield plate 86 may be arranged between at least one of the power amplifier 51, the transmission filter 31T, the switch circuit 21, and the matching circuits 71, 73, and 77 and at least one of the power amplifier 52, the transmission filter 43T, the switch circuit 22, and the matching circuits 72, 75, and 78 in the plan view.

In other words, the first transmission component may be any one of (1) the power amplifier 51, (2) the transmission filter 31T, (3) the switch circuit 21, (4) a first inductor connected to the first transmission path, and (5) a first capacitor connected to the first transmission path. In addition, the second transmission component may be any one of (1) the power amplifier 52, (2) the transmission filter 43T, (3) the switch circuit 22, (4) a second inductor connected to the second transmission path, and (5) a second capacitor connected to the second transmission path. That is, in the high-frequency module 1 according to the present embodiment, when the module substrate 91 is viewed in a plan view, the metal shield plate 86 may be arranged between at least one first transmission component and at least one second transmission component.

Accordingly, it is possible to provide the high-frequency module 1A in which the isolation between the first transmission path and the second transmission path is improved as compared with a high-frequency module in which the metal shield plate 86 is not arranged.

Note that it is desirable that the first transmission component be one of the power amplifier 51 and the first inductor, and the second transmission component be one of the power amplifier 52 and the second inductor.

Because the power amplifiers 51 and 52 output high power transmission signals, two transmission signals are likely to interfere with each other during two-uplink. In addition, because the first inductor and the second inductor are magnetic-field coupled, two transmission signals are likely to interfere with each other due to the magnetic field coupling during two-uplink. Accordingly, the isolation between the first transmission path and the second transmission path can be effectively improved.

Next, a detailed structure of the metal shield plate 86 will be described with reference to FIGS. 3A to 3C.

Figure 3A:
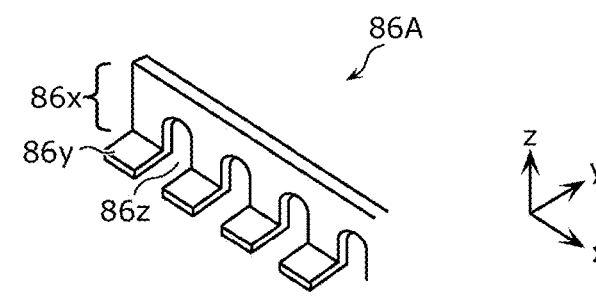
FIG. 3A is an external perspective view illustrating a first example of a metal shield plate.

FIG. 3A is an external perspective view of a metal shield plate 86A. The metal shield plate 86A illustrated in FIG. 3A is an example of the metal shield plate 86 according to Example 1. The metal shield plate 86A is erected from the principal surface 91a (not illustrated) in a z-axis positive direction. Between the metal shield plate 86A and the principal surface 91a, holes 86z penetrating in a normal direction (y-axis direction) of the metal shield plate 86A are formed.

In addition, the metal shield plate 86A includes a main body portion 86x erected from the principal surface 91a in the z-axis positive direction, and bonding portions 86y extending in the principal surface 91a side in parallel with the principal surface 91a and bonded to the ground electrode (not illustrated) on the principal surface 91a.

According to the structure of the metal shield plate 86A, because the holes 86z are formed between the main body portion 86x and the principal surface 91a, in the step of forming the resin member 92 on the principal surface 91a, good flowability of a liquid resin in the vicinity of the metal shield plate 86A can be ensured. Therefore, it is possible to suppress occurrence of a gap or the like in which the resin member 92 is not formed in the vicinity of the metal shield plate 86A.

Figure 3B:
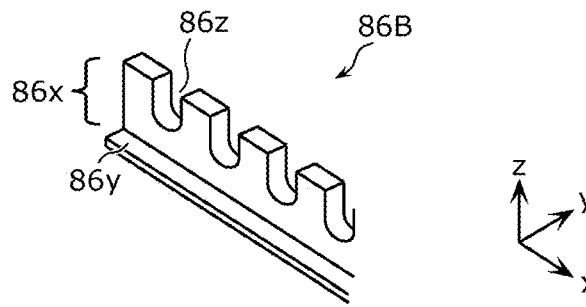
FIG. 3B is an external perspective view illustrating a second example of the metal shield plate.

FIG. 3B is an external perspective view of a metal shield plate 86B. The metal shield plate 86B illustrated in FIG. 3B is an example of the metal shield plate 86 according to Example 1. The metal shield plate 86B is erected from the principal surface 91a (not illustrated) in the z-axis positive direction. Holes 86z penetrating in the normal direction (y-axis direction) of the metal shield plate 86B are formed between the metal shield plate 86B and the metal shield layer 85.

In addition, the metal shield plate 86B includes a main body portion 86x erected from the principal surface 91a in the z-axis positive direction, and a bonding portion 86y extending in the principal surface 91a side in parallel with the principal surface 91a and bonded to the ground electrode (not illustrated) on the principal surface 91a.

According to the structure of the metal shield plate 86B, because the holes 86z are formed between the main body portion 86x and the metal shield layer 85, in the step of forming the resin member 92 on the principal surface 91$a$, good flowability of the liquid resin in the vicinity of the metal shield plate 86B can be ensured. Therefore, it is possible to suppress occurrence of a gap or the like in which the resin member 92 is not formed in the vicinity of the metal shield plate 86B. In addition, because the holes 86$z$ are not formed in a region in contact with the principal surface 91$a$ (a lower region of the main body portion 86$x$), isolation between the circuit components arranged on the principal surface 91$a$ with the metal shield plate 86B interposed therebetween is improved.

Figure 3C:
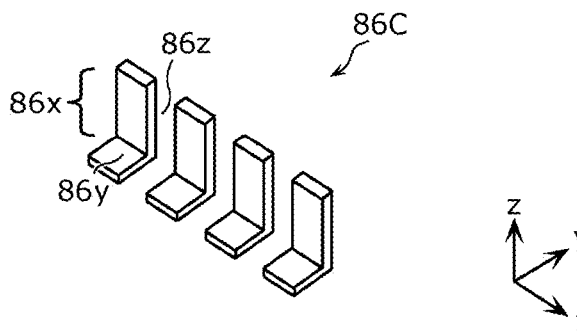
FIG. 3C is an external perspective view illustrating a third example of the metal shield plate.

FIG. 3C is an external perspective view of a metal shield plate 86C. The metal shield plate 86C illustrated in FIG. 3C is an example of the metal shield plate 86 according to Example 1. The metal shield plate 86C is erected from the principal surface 91$a$ (not illustrated) in the z-axis positive direction. Between the principal surface 91$a$ and the metal shield layer 85, holes 86$z$ penetrating in the normal direction (y-axis direction) of the metal shield plate 86C are formed.

In addition, the metal shield plate 86C includes a main body portion 86$x$ erected from the principal surface 91$a$ in the z-axis positive direction, and bonding portions 86$y$ extending in the principal surface 91$a$ side in parallel with the principal surface 91$a$ and bonded to the ground electrode (not illustrated) on the principal surface 91$a$. In the metal shield plate 86C, a plurality of main body portions 86$x$ is discretely arranged with the holes 86$z$ interposed therebetween, and a plurality of bonding portions 86$y$ is discretely arranged with the holes 86$z$ interposed therebetween.

According to the structure of the metal shield plate 86C, because the holes 86$z$ are formed between the principal surface 91$a$ and the metal shield layer 85, in the step of forming the resin member 92 on the principal surface 91$a$, good flowability of the liquid resin in the vicinity of the metal shield plate 86C can be ensured. Therefore, it is possible to suppress occurrence of a gap or the like in which the resin member 92 is not formed in the vicinity of the metal shield plate 86C.

Note that, the structural example of the metal shield plate 86 is not limited to the above-described metal shield plates 86A to 86C. For example, a plurality of holes 86$z$ may be arranged from the principal surface 91$a$ toward the metal shield layer 85. The direction in which the bonding portion 86$y$ extends is not limited to a y-axis negative direction as illustrated in FIGS. 3A to 3C and may be a y-axis positive direction. Further, the metal shield plate 86 may include both the bonding portions 86$y$ extending in the y-axis negative direction and the bonding portions 86$y$ extending in the y-axis positive direction.

Figure 4:
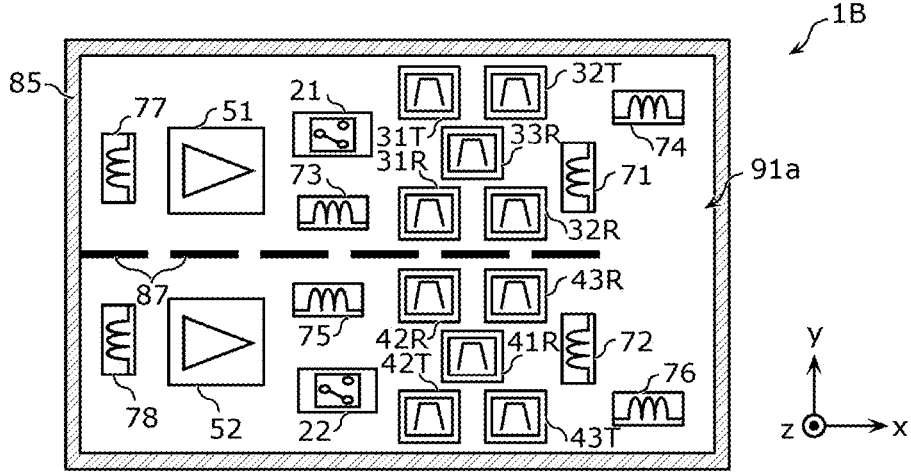
FIG. 4 is a plan view of a high-frequency module according to a modification.

3. Circuit Component Arrangement Configuration of High-Frequency Module 1B According to Modification FIG. 4 is a plan view of a high-frequency module 1B according to a modification. FIG. 4 illustrates a layout diagram of circuit components when the principal surface 91$a$, of the principal surfaces 91$a$ and 91$b$ of the module substrate 91 facing each other, is viewed from the z-axis positive direction side. In addition, in FIG. 4, each circuit component is provided with a mark indicating a function thereof so that the arrangement relationship of the circuit components can be easily perceived, but the mark is not provided in the actual high-frequency module 1B.

The high-frequency module 1B according to the modification specifically represents the arrangement configuration of the circuit elements constituting the high-frequency module 1 according to the embodiment.

The high-frequency module 1B according to the present modification is, compared to the high-frequency module 1A according to Example 1, different in that a bonding wire 87 is arranged instead of the metal shield plate 86. Hereinafter, with respect to the high-frequency module 1B according to the present modification, description of the same configuration as that of the high-frequency module 1A according to Example 1 will be omitted, and a different configuration will be mainly described.

The bonding wire 87 is an example of the first ground metal member and is bonded to the ground electrode on the principal surface 91$a$. Note that the bonding wire 87 may be further bonded to the metal shield layer 85 or may be connected to the ground electrode layer 95G formed in the module substrate 91. Because the bonding wire 87 is connected to the ground, the electromagnetic field shielding function is enhanced. As illustrated in FIG. 4, it is desirable that a plurality of bonding wires 87 be discretely arranged.

As illustrated in FIG. 4, in a plan view of the module substrate 91, the plurality of bonding wires 87 is arranged between the power amplifier 51, the transmission filter 31T, the switch circuit 21, and the matching circuits 71, 73, and 77 and the power amplifier 52, the transmission filter 43T, the switch circuit 22, and the matching circuits 72, 75, and 78.

Here, each of the power amplifier 51, the transmission filter 31T, the switch circuit 21, and the matching circuits 71, 73, and 77 is the first transmission component arranged on the first transmission path that transmits a transmission signal in Band A. In addition, each of the power amplifier 52, the transmission filter 43T, the switch circuit 22, and the matching circuits 72, 75, and 78 is the second transmission component arranged on the second transmission path that transmits a transmission signal in Band C.

According to the above configuration, by strengthening the electromagnetic field shielding function by the bonding wire 87, mutual interference between the first transmission component and the second transmission component during two-uplink of the transmission signal in Band A and the transmission signal in Band C can be suppressed. Therefore, it is possible to provide the high-frequency module 1B in which the isolation between the first transmission path and the second transmission path is improved.

Note that, in the high-frequency module 1B according to the present modification, in a plan view described above, the bonding wire 87 may be arranged between at least one of the power amplifier 51, the transmission filter 31T, the switch circuit 21, and the matching circuits 71, 73, and 77 and at least one of the power amplifier 52, the transmission filter 43T, the switch circuit 22, and the matching circuits 72, 75, and 78.

4. Circuit Component Arrangement Configuration of High-Frequency Module 1C According to Example 2

Figure 5A:
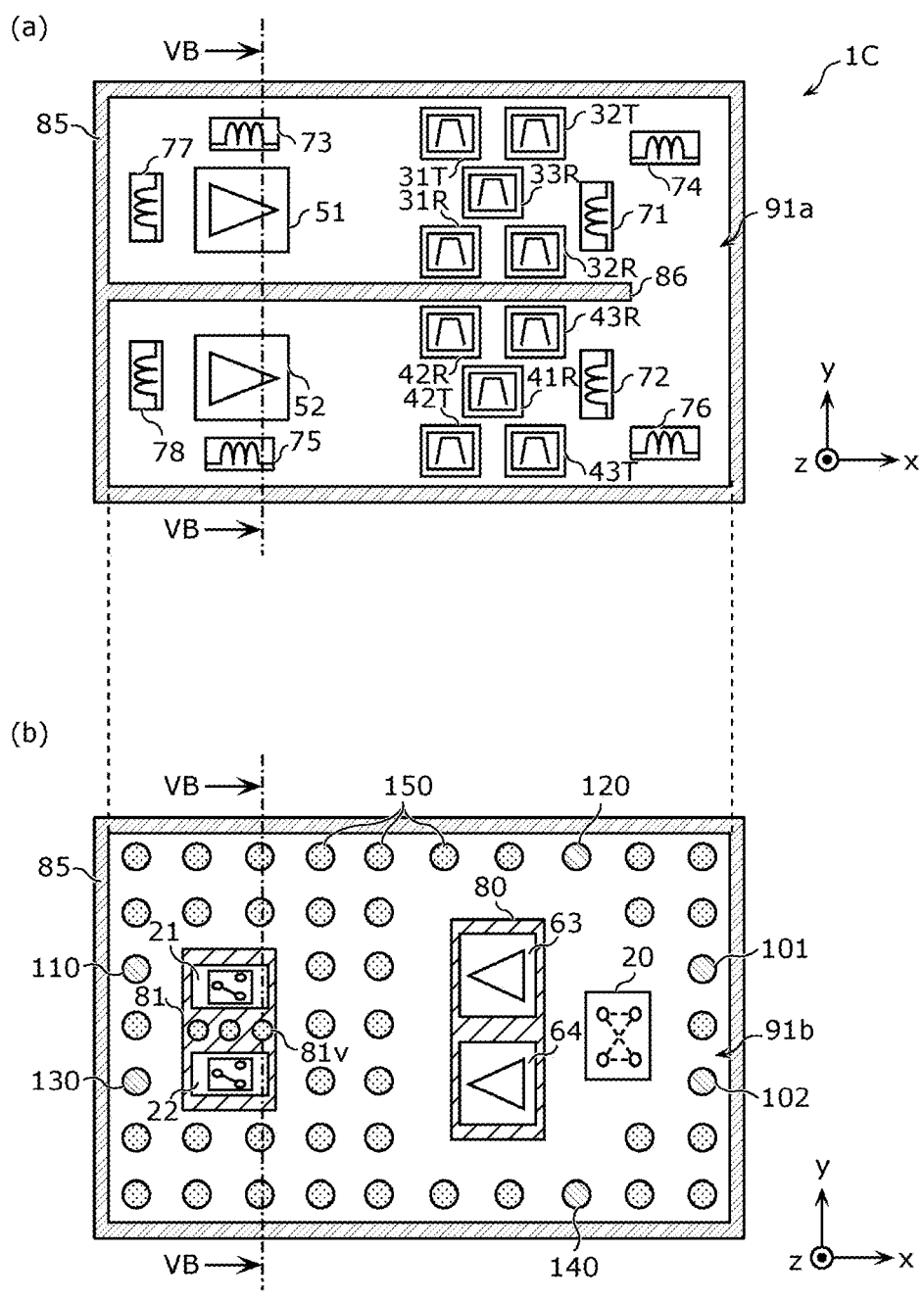
FIG. 5A is a plan view of a high-frequency module according to Example 2.
Figure 5B:
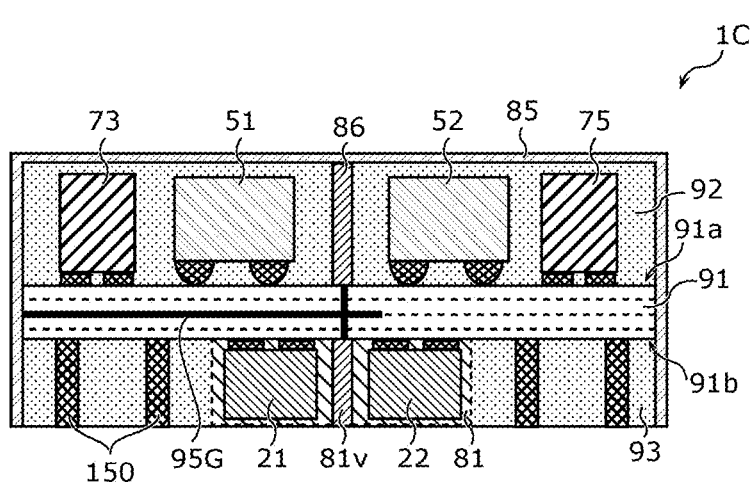
FIG. 5B is a sectional view of the high-frequency module according to Example 2.

FIG. 5A is a plan view of a high-frequency module 1C according to Example 2. In addition, FIG. 5B is a sectional view of the high-frequency module 1C according to Example 2, specifically, a sectional view taken along a line VB-VB of FIG. 5A. Note that, in (a) of FIG. 5A, a layout diagram of circuit components is illustrated when the principal surface 91$a$, of the principal surfaces 91$a$ and 91$b$ of the module substrate 91 facing each other, is viewed from the z-axis positive direction side. On the other hand, in (b)

of FIG. 5A, a perspective view of the arrangement of the circuit components is illustrated when the principal surface 91*b* is viewed from the z-axis positive direction side. In addition, in FIG. 5A, each circuit component is provided with a mark indicating a function thereof so that the arrangement relationship of the circuit components can be easily perceived, but the mark is not provided in the actual high-frequency module 1C.

The high-frequency module 1C according to Example 2 specifically represents the arrangement configuration of the circuit elements constituting the high-frequency module 1 according to the embodiment.

The high-frequency module 1C according to the present example is, compared to the high-frequency module 1A according to Example 1, different in that the switch circuits 21 and 22 are arranged on the principal surface 91*b*. Hereinafter, with respect to the high-frequency module 1C according to the present example, description of the same configuration as that of the high-frequency module 1A according to Example 1 will be omitted, and a different configuration will be mainly described.

As illustrated in FIGS. 5A and 5B, in the high-frequency module 1C according to the present example, the power amplifiers 51 and 52, the first multiplexer, the second multiplexer, and the matching circuits 71 to 78 are arranged on the principal surface 91*a*. On the other hand, the switch circuits 21 and 22, the low noise amplifiers 63 and 64, and the switch circuit 20 are arranged on the principal surface 91*b*.

The external connection terminals 150 are arranged on the principal surface 91*b* of the module substrate 91. The high-frequency module 1C exchanges electric signals with an external substrate arranged in the z-axis negative direction side of the high-frequency module 1C via a plurality of external connection terminals 150. In addition, some of the plurality of external connection terminals 150 are set to the ground potential of the external substrate. Of the principal surfaces 91*a* and 91*b*, on the principal surface 91*b* facing the external substrate, the circuit components that are difficult to reduce in height are not arranged, and the switch circuits 20, 21, and 22 and the low noise amplifiers 63 and 64 that are easy to reduce in height are arranged.

The metal shield plate 86 is an example of the first ground metal member and is the metal wall body erected from the principal surface 91*a* toward the top surface of the resin member 92 in the z-axis positive direction side. The metal shield plate 86 is bonded to the ground electrode on the principal surface 91*a* and the metal shield layer 85. In other words, because the metal shield plate 86 is connected to the ground at least two locations above and below the metal shield plate 86, an electromagnetic field shielding function is enhanced.

As illustrated in (a) of FIG. 5A, in a plan view of the module substrate 91, the metal shield plate 86 is arranged between the power amplifier 51, the transmission filter 31T, and the matching circuits 71, 73, and 77 and the power amplifier 52, the transmission filter 43T, and the matching circuits 72, 75, and 78.

In addition, when the module substrate 91 is viewed in a plan view, via conductors 81*v* are arranged between the switch circuit 21 and the switch circuit 22 on the principal surface 91*b*.

The via conductors 81*v* are each an example of a second ground metal member and erected from the principal surface 91*b* toward a top surface of the resin member 93 in the z-axis negative direction side. The via conductors 81*v* are bonded to the ground electrode on the principal surface 91*b*. That is, because the via conductors 81*v* are connected to the ground, the electromagnetic field shielding function is enhanced.

Here, each of the power amplifier 51, the transmission filter 31T, the switch circuit 21, and the matching circuits 71, 73, and 77 is the first transmission component arranged on the first transmission path that transmits a transmission signal in Band A. In addition, each of the power amplifier 52, the transmission filter 43T, the switch circuit 22, and the matching circuits 72, 75, and 78 is the second transmission component arranged on the second transmission path that transmits a transmission signal in Band C.

According to the above-described configuration, by strengthening the electromagnetic field shielding function by the metal shield plate 86 and the via conductors 81*v*, mutual interference between the first transmission component and the second transmission component during two-uplink of the transmission signal in Band A and the transmission signal in Band C can be suppressed. Therefore, it is possible to provide the high-frequency module 1C in which the isolation between the first transmission path and the second transmission path is improved.

Note that, as illustrated in (b) of FIG. 5A, the switch circuits 21 and 22 may be included in one semiconductor IC 81. At this time, the via conductors 81*v* are formed in the semiconductor IC 81.

Accordingly, it is possible to provide a small-sized high-frequency module 1C in which the isolation between the first transmission path and the second transmission path is improved.

Note that, the second ground metal member arranged between the switch circuit 21 and the switch circuit 22 on the principal surface 91*b* may be the external connection terminals 150 connected to the ground or may be the bonding wire bonded to the ground electrode on the principal surface 91*b*.

5. Circuit Component Arrangement Configuration of High-Frequency Module 1D According to Example 3

Figure 6A:
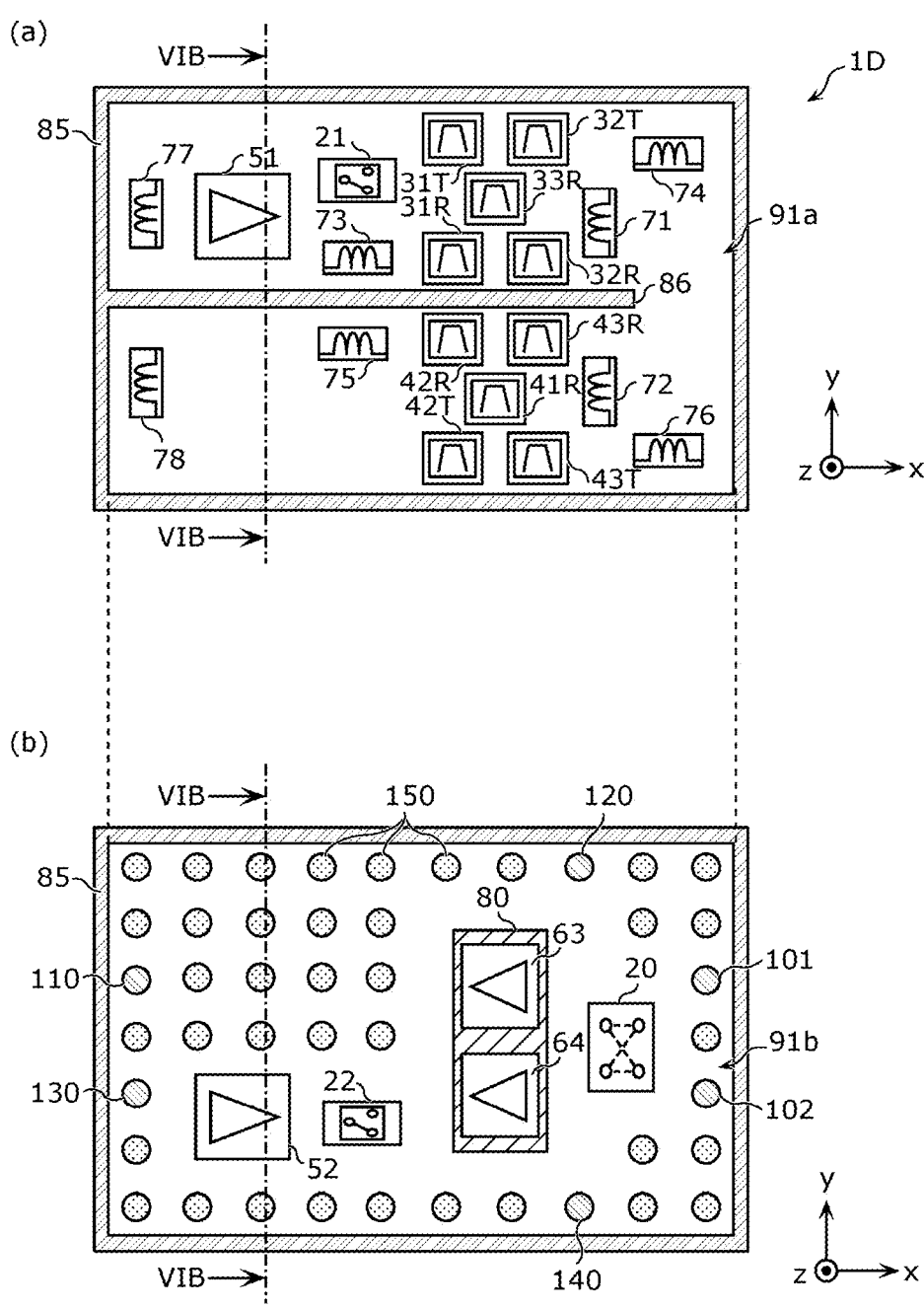
FIG. 6A is a plan view of a high-frequency module according to Example 3.
Figure 6B:
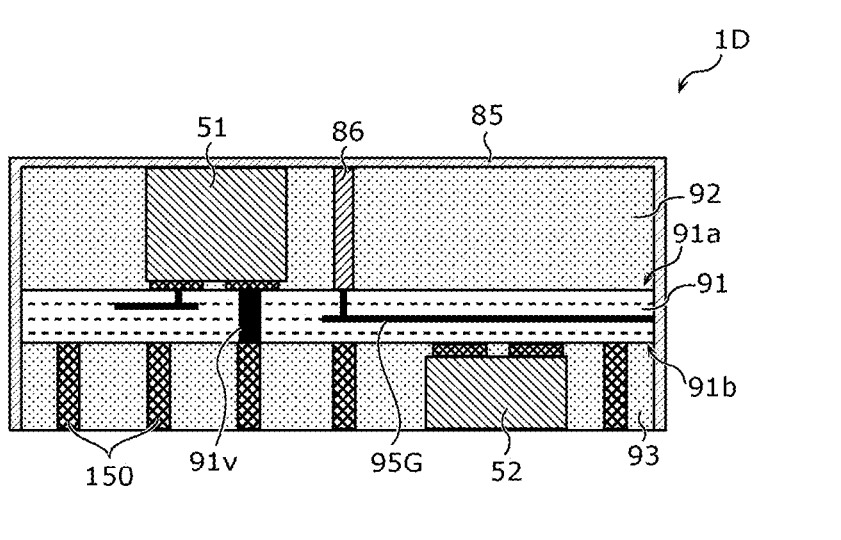
FIG. 6B is a sectional view of the high-frequency module according to Example 3.

FIG. 6A is a plan view of a high-frequency module 1D according to Example 3. In addition, FIG. 6B is a sectional view of the high-frequency module 1D according to Example 3, specifically, a sectional view taken along a line VIB-VIB of FIG. 6A. Note that, in (a) of FIG. 6A, a layout diagram of circuit components is illustrated when the principal surface 91*a*, of the principal surfaces 91*a* and 91*b* of the module substrate 91 facing each other, is viewed from the z-axis positive direction side. On the other hand, in (b) of FIG. 6A, a perspective view of the arrangement of the circuit components is illustrated when the principal surface 91*b* is viewed from the z-axis positive direction side. In addition, in FIG. 6A, each circuit component is provided with a mark indicating a function thereof so that the arrangement relationship of the circuit components can be easily perceived, but the mark is not provided in the actual high-frequency module 1D.

The high-frequency module 1D according to Example 3 specifically represents the arrangement configuration of the circuit elements constituting the high-frequency module 1 according to the embodiment.

The high-frequency module 1D according to the present example is, compared to the high-frequency module 1A according to Example 1, different in that the power amplifier 52 and the switch circuit 22 are arranged on the principal surface 91*b*. Hereinafter, with respect to the high-frequency module 1D according to the present example, description of the same configuration as that of the high-frequency module 1A according to Example 1 will be omitted, and a different configuration will be mainly described.

As illustrated in FIGS. 6A and 6B, in the high-frequency module 1D according to the present example, the power amplifier 51, the first multiplexer, the second multiplexer, the switch circuit 21, and the matching circuits 71 to 78 are arranged on the principal surface 91a. On the other hand, the power amplifier 52, the switch circuits 20 and 22, and the low noise amplifiers 63 and 64 are arranged on the principal surface 91b.

Accordingly, because the power amplifier 51 and the power amplifier 52 are arranged to be distributed on both sides across the module substrate 91, it is possible to suppress mutual interference between the transmission signal in Band A and the transmission signal in Band C during two-uplink. Thus, it is possible to provide the high-frequency module 1D in which the isolation between the first transmission path and the second transmission path is improved. In addition, it is possible to suppress deterioration of amplification characteristics of the power amplifiers 51 and 52 due to heat generated from both the power amplifiers 51 and 52 during the above two-uplink. Further, because the heat generated from both the power amplifiers 51 and 52 can be dispersed, a temperature rise of the high-frequency module 1D can be suppressed.

Further, when the module substrate 91 is viewed in a plan view, the power amplifier 51 and the power amplifier 52 do not overlap each other.

Accordingly, because a large distance can be secured between the first transmission path and the second transmission path, mutual interference between the transmission signal in Band A and the transmission signal in Band C during two-uplink can be further suppressed.

In addition, the switch circuit 21 is arranged on the principal surface 91a, and the switch circuit 22 is arranged on the principal surface 91b.

Accordingly, because the switch circuit 21 in the first transmission path and the switch circuit 22 in the second transmission path are arranged to be distributed on the both sides across the module substrate 91, it is possible to further suppress mutual interference between the transmission signal in Band A and the transmission signal in Band C during two-uplink.

Further, in the present example, in addition to the power amplifier 52 and the switch circuit 22, at least one of the second multiplexer and the matching circuits 72, 75, and 78 in the second transmission path may be arranged on the principal surface 91b.

Accordingly, the isolation between the first transmission path and the second transmission path can be enhanced.

In addition, the power amplifier 51 has a bottom surface (first surface) and a top surface (second surface) facing each other. The bottom surface faces the principal surface 91a, and the top surface is in contact with the metal shield layer 85.

Accordingly, because heat dissipation characteristics of the power amplifier 51 is improved, it is possible to suppress deterioration of the amplification characteristics of the power amplifier 51.

Further, the power amplifier 51 is connected to the external connection conductors 150 with a heat dissipation via conductor 91v that penetrates the module substrate 91 interposed therebetween.

Accordingly, because the heat dissipation characteristics of the power amplifier 51 is improved, it is possible to suppress deterioration of the amplification characteristics of the power amplifier 51.

Note that a maximum output power of the power amplifier 51 may be larger than a maximum output power of the power amplifier 52. Even in this case, because the power amplifier 51 is in contact with the metal shield layer 85, a temperature rise of the power amplifier 51 can be suppressed.

Further, the maximum output power of the power amplifier 52 may be larger than the maximum output power of the power amplifier 51. In this case, a top surface of the power amplifier 52, of a bottom surface and the top surface of the power amplifier 52, may be configured to be in contact with a heat dissipation electrode provided on the external substrate. Accordingly, because the power amplifier 52 is in contact with the heat dissipation electrode, it is possible to suppress a temperature rise of the power amplifier 52.

Here, each of the power amplifier 51, the transmission filter 31T, the switch circuit 21, and the matching circuits 71, 73, and 77 is the first transmission component arranged on the first transmission path that transmits a transmission signal in Band A. In addition, each of the transmission filter 43T and the matching circuits 72, 75, and 78 is the second transmission component arranged on the second transmission path that transmits a transmission signal in Band C.

According to the configuration described above, by strengthening the electromagnetic field shielding function by the metal shield plate 86, mutual interference between the first transmission component and the second transmission component during two-uplink of the transmission signal in Band A and the transmission signal in Band C can be suppressed. Thus, it is possible to provide the high-frequency module 1D in which the isolation between the first transmission path and the second transmission path is improved.

6. Effects and the Like

As described above, the high-frequency module 1A according to the present embodiment is capable of performing two-uplink for simultaneously transmitting a signal in the transmission band of Band A and a signal in the transmission band of Band C, and includes the module substrate 91 having the principal surfaces 91a and 91b facing each other, the metal shield plate 86 arranged on the principal surface 91a, the power amplifiers 51 and 52, the transmission filter 31T including the transmission band of Band A in a pass band, and the transmission filter 43T including the transmission band of Band C in a pass band. When the module substrate 91 is viewed in a plan view, the metal shield plate 86 is arranged between the first transmission component arranged on the principal surface 91a and the second transmission component arranged on the principal surface 91a. Here, the first transmission component is one of (1) the power amplifier 51, (2) the transmission filter 31T, (3) the switch circuit 21, (4) the first inductor connected to one of the power amplifier 51, the transmission filter 31T, and the switch circuit 21, and the first capacitor connected to one of the power amplifier 51, the transmission filter 31T, and the switch circuit 21, and the second transmission component is one of (1) the power amplifier 52, (2) the transmission filter 43T, (3) the switch circuit 22, (4) the second inductor connected to one of the power amplifier 52, the transmission filter 43T, and the switch circuit 22, and (5) the second capacitor connected to one of the power amplifier 52, the transmission filter 43T, and the switch circuit 22.

Accordingly, by strengthening the electromagnetic field shielding function by the metal shield plate 86, mutual interference between the first transmission component and the second transmission component during two-uplink of the transmission signal in Band A and the transmission signal in Band C can be suppressed. Thus, it is possible to provide the high-frequency module 1A in which the isolation between the first transmission path and the second transmission path is improved.

In addition, in the high-frequency module 1A, the first transmission component may be one of the power amplifier 51 and the first inductor, and the second transmission component may be one of the power amplifier 52 and the second inductor.

Because the power amplifiers 51 and 52 output high power transmission signals, two transmission signals are likely to interfere with each other during two-uplink. In addition, because the first inductor and the second inductor are magnetic-field coupled, two transmission signals are likely to interfere with each other due to the magnetic field coupling during two-uplink. Accordingly, the isolation between the first transmission path and the second transmission path can be effectively improved.

In addition, in the high-frequency module 1A, the power amplifiers 51 and 52, the transmission filters 31T and 43T, the switch circuits 21 and 22, the first inductor, and the second inductor may be arranged on the principal surface 91a.

In addition, in the high-frequency module 1C, the power amplifiers 51 and 52, the transmission filters 31T and 43T, the first inductor, and the second inductor may be arranged on the principal surface 91a, the switch circuits 21 and 22 may be arranged on the principal surface 91b, when the module substrate 91 is viewed in a plan view, the via conductors 81v may be arranged between the switch circuit 21 and the switch circuit 22.

Accordingly, by strengthening the electromagnetic field shielding function by the metal shield plate 86 and the via conductors 81v, mutual interference between the first transmission component and the second transmission component during two-uplink of the transmission signal in Band A and the transmission signal in Band C can be suppressed. Therefore, it is possible to provide the high-frequency module 1C in which the isolation between the first transmission path and the second transmission path is improved.

In addition, in the high-frequency module 1C, the switch circuits 21 and 22 may be included in one semiconductor IC 81.

Accordingly, it is possible to provide the small-sized high-frequency module 1C in which the isolation between the first transmission path and the second transmission path is improved.

In addition, in the high-frequency module 1D, the power amplifier 51 may be arranged on the principal surface 91a, and the power amplifier 52 may be arranged on the principal surface 91b.

Accordingly, mutual interference between the transmission signal in Band A and the transmission signal in Band C during two-uplink can be suppressed. In addition, it is possible to suppress deterioration of the amplification characteristics of the power amplifiers 51 and 52 due to heat generated from both the power amplifiers 51 and 52 during the above two-uplink.

In addition, in the high-frequency module 1D, the maximum output power of the power amplifier 51 may be larger than the maximum output power of the power amplifier 52.

Further, in the high-frequency module 1D, the maximum output power of the power amplifier 52 may be larger than the maximum output power of the power amplifier 51.

In addition, in the high-frequency module 1D, when the module substrate 91 is viewed in a plan view, the power amplifier 51 and the power amplifier 52 do not have to overlap with each other.

Accordingly, because a large distance can be secured between the first transmission path and the second transmission path, mutual interference between the transmission signal in Band A and the transmission signal in Band C during two-uplink can be further suppressed.

In addition, the high-frequency module 1A may further include the low noise amplifiers 63 and 64 arranged on the principal surface 91b.

Accordingly, because the power amplifiers 51 and 52 and the low noise amplifiers 63 and 64 are distributed on both sides across the module substrate 91, the isolation between transmission and reception can be improved.

In addition, the high-frequency module 1A may further include the resin member 92 covering at least a part of the principal surface 91a, the first transmission component, and the second transmission component, and the metal shield layer 85 formed on the surface of the resin member 92 and set to the ground potential. The metal shield plate 86 may be erected from the principal surface 91a toward the surface of the resin member 92 and may be bonded to the ground electrode on the principal surface 91a and the metal shield layer 85.

Further, in the high-frequency module 1D, the bottom surface of the power amplifier 51 may face the principal surface 91a, and the top surface may be in contact with the metal shield layer 85.

Accordingly, because the heat dissipation characteristics of the power amplifier 51 is improved, it is possible to suppress deterioration of the amplification characteristics of the power amplifier 51.

Further, in the high-frequency module 1B, the first ground metal member arranged between the first transmission component and the second transmission component may be the bonding wire 87, and the bonding wires 87 may be bonded to the ground electrode on the principal surface 91a.

In addition, the high-frequency module 1A includes the module substrate 91, the first ground metal member, the power amplifiers 51 and 52, the first multiplexer, the second multiplexer, and the switch circuit 20 having the terminals 20a and 20b, the terminal 20c connected to the antenna 2A, and the terminal 20d connected to the antenna 2B. The first multiplexer has the transmission filter 31T and the reception filter 31R which takes the reception band of Band A as a pass band and does not have a transmission filter which takes the transmission band of Band C as a pass band. The second multiplexer has the transmission filter 43T and the reception filter 43R which takes the reception band of Band C as a pass band and does not have a transmission filter which takes the transmission band of Band A as a pass band. The terminal 20a may be connected to the transmission filter 31T and the reception filter 31R, and the terminal 20b may be connected to the transmission filter 43T and the reception filter 43R. In the switch circuit 20, the conduction between the terminal 20c and the terminal 20a, and the conduction between the terminal 20c and the terminal 20b may be exclusively selected, and the conduction between the terminal 20d and the terminal 20a, and the conduction between the terminal 20d and the terminal 20b may be exclusively selected.

Accordingly, because the high-frequency module 1A includes the switch circuit 20, the first multiplexer, and the second multiplexer, by switching the connection state of the switch circuit 20, the high-frequency signals in Bands A and C can be optionally distributed to the antennas 2A and 2B, and two-uplink simultaneous transmission and two-uplink two-downlink simultaneous transmission can be performed. Here, because the first multiplexer does not have a transmission filter of Band C and the second multiplexer does not have a transmission filter of Band A, it is possible to provide a small-sized high-frequency module 1A capable of performing two-uplink two-downlink simultaneous transmission while improving the isolation between the first transmission path and the second transmission path during two-uplink.

In addition, in the high-frequency module 1A, the first multiplexer may further include the reception filter 33R which takes the reception band of Band C as a pass band, and the second multiplexer may further include the reception filter 41R which takes the reception band of Band A as a pass band.

In addition, in the high-frequency module 1A, two-uplink for simultaneously transmitting two transmission signals of transmission signals in Band A, transmission signals in Band C, and transmission signals in Band B, and two-downlink for simultaneously receiving two reception signals of reception signals in Band A, the reception signals in Band C, and the reception signals in Band B are performed, the first multiplexer may further include the transmission filter 32T which takes the transmission band of Band B as a pass band and the reception filter 32R which takes the reception band of Band B as a pass band, and the second multiplexer may further include the transmission filter 42T which takes the transmission band of Band B as a pass band and the reception filter 42R which takes the reception band of Band B as a pass band.

Accordingly, the high-frequency module 1A can optionally distribute high-frequency signals in Bands A, B, and C to the antennas 2A and 2B to perform two-uplink simultaneous transmission and two-uplink two-downlink simultaneous transmission. Here, the transmission filter of Band C can be reduced in the first multiplexer, and the transmission filter of Band A can be reduced in the second multiplexer. Therefore, it is possible to provide the small-sized high-frequency module 1A capable of two-uplink simultaneous transmission and two-downlink simultaneous transmission.

In addition, the communication device 5 includes the high-frequency module 1 and the RFIC 3 that processes high-frequency signals transmitted and received by the high-frequency module 1.

Accordingly, it is possible to provide the communication device 5 in which isolation between the two transmission paths during two-uplink is improved.

Other Embodiments

Although the high-frequency module and the communication device according to the embodiment have been described above with reference to the examples and the modification, the high-frequency module and the communication device according to the present disclosure are not limited to the above-described embodiment, examples, and modification. Other embodiments realized by combining arbitrary constituent elements in the above-described embodiment, examples, and modification, modifications obtained by applying various modifications conceived by a person skilled in the art to the above-described embodiment, examples, and modification without departing from the gist of the present disclosure, and various apparatuses incorporating the high-frequency module and the communication device according to the present disclosure are also included in the present disclosure.

Note that, in the above-described embodiment, examples, and modification, although a configuration of two-uplink two-downlink in which the high-frequency signal in the first frequency band and the high-frequency signal in the second frequency band are simultaneously used has been exemplified, the configurations of the high-frequency module and the communication device according to the present disclosure can also be applied to a configuration of uplink and/or downlink (for example, three-uplink three-downlink) in which three or more different frequency bands are simultaneously used. That is, two-uplink in the above-described embodiment, examples, and modification includes multi-uplink that simultaneously uses three or more different frequency bands, and is configured to perform uplink and/or downlink that simultaneously use three or more different frequency bands, and a high-frequency module or a communication device including the configuration of the high-frequency module or the communication device according to the above-described embodiment, examples, and modification are also included in the present disclosure.

For example, in the high-frequency modules and the communication devices according to the above-described embodiment, examples, and modification, another high-frequency circuit element, wiring line, or the like may be inserted between paths connecting the respective circuit elements and the signal paths disclosed in the accompanying drawings.

INDUSTRIAL APPLICABILITY

The present disclosure can be widely used in communication devices such as mobile phones as a front-end module that supports multi-band/multi-mode using a carrier aggregation method.

REFERENCE SIGNS LIST

1 1A, 1B, 1C, 1D HIGH-FREQUENCY MODULE
2A, 2B ANTENNA
3 RF SIGNAL PROCESSING CIRCUIT (RFIC)
4 BASEBAND SIGNAL PROCESSING CIRCUIT (BBIC)
5 COMMUNICATION DEVICE
20, 21, 22, 23, 24 SWITCH CIRCUIT
20a, 20b, 20c, 20d TERMINAL
21a, 22a COMMON TERMINAL
21c, 21d, 22c, 22d SELECTION TERMINAL
31R, 32R, 33R, 41R, 42R, 43R RECEPTION FILTER
31T, 32T, 42T, 43T TRANSMISSION FILTER
51, 52 POWER AMPLIFIER
63, 64 LOW NOISE AMPLIFIER
71, 72, 73, 74, 75, 76, 77, 78 MATCHING CIRCUIT
80, 81 SEMICONDUCTOR IC
81v VIA CONDUCTOR
85 METAL SHIELD LAYER
86 86A, 86B, 86C METAL SHIELD PLATE
86x MAIN BODY PORTION
86y BONDING PORTION
86z HOLE
87 BONDING WIRE
91 MODULE SUBSTRATE
91a, 91b PRINCIPAL SURFACE
91v HEAT DISSIPATION VIA CONDUCTOR
92, 93 RESIN MEMBER

95G GROUND ELECTRODE LAYER
101, 102 TRANSMISSION/RECEPTION TERMINAL
110, 130 TRANSMISSION INPUT TERMINAL
120, 140 RECEPTION OUTPUT TERMINAL
150 EXTERNAL CONNECTION TERMINAL

The invention claimed is:

1. A high-frequency module capable of performing two-uplink for simultaneously transmitting a signal in a first transmission band included in a first frequency band and a signal in a second transmission band included in a second frequency band different from the first frequency band, the high-frequency module comprising:

a module substrate having a first principal surface and a second principal surface facing each other;

a first ground metal member arranged on the first principal surface;

a first power amplifier, a second power amplifier, a first transmission filter, a second transmission filter, a first inductor, and a second inductor are arranged on the first principal surface; and a first switch and a second switch are arranged on the second principal surface, wherein the first switch is configured to switch connection and disconnection between the first power amplifier and the first transmission filter, the second switch is configured to switch connection and disconnection between the second power amplifier and the second transmission filter, the first transmission filter is connected to the first power amplifier and includes the first transmission band in a pass band, the second transmission filter is connected to the second power amplifier and includes the second transmission band in a pass band, in a plan view, the first ground metal member is arranged on the first principal surface between a first transmission component and a second transmission component, in a plan view, a second ground metal member is arranged on the second principal component between the first switch and the second switch.

2. The high-frequency module according to claim 1, wherein the first transmission component is one of the first power amplifier and the first inductor, and the second transmission component is one of the second power amplifier and the second inductor.

3. The high-frequency module according to claim 1, wherein the first switch and the second switch are included in one semiconductor IC, and the second ground metal member is a via conductor formed in the semiconductor IC.

4. The high-frequency module according to claim 1, wherein a maximum output power of the first power amplifier is larger than a maximum output power of the second power amplifier.

5. The high-frequency module according to claim 1, wherein a maximum output power of the second power amplifier is larger than a maximum output power of the first power amplifier.

6. The high-frequency module according to claim 1, wherein, in a plan view, the first power amplifier and the second power amplifier do not overlap with each other.

7. The high-frequency module according to claim 1, further comprising:

a low noise amplifier arranged on the second principal surface and connected to a reception path for amplifying a high-frequency reception signal.

8. The high-frequency module according to claim 1, further comprising:

a resin member configured to cover at least a part of the first principal surface, the first transmission component, and the second transmission component; and a metal shield layer formed on a surface of the resin member and set to a ground potential, wherein the first ground metal member is a metal shield plate erected from the first principal surface toward the surface of the resin member, and the metal shield plate is bonded to a ground electrode on the first principal surface and the metal shield layer.

9. The high-frequency module according to claim 8, wherein the first power amplifier has a first surface and a second surface facing each other, the first surface faces the first principal surface, and the second surface is in contact with the metal shield layer.

10. A communication device comprising:

the high-frequency module according to claim 8; and an RF signal processing circuit configured to process a high-frequency signal transmitted and received by the high-frequency module.

11. The high-frequency module according to claim 1, wherein the first ground metal member is a bonding wire, and the bonding wire is bonded to a ground electrode on the first principal surface.

12. The high-frequency module according to claim 1, comprising:

the module substrate;

the first ground metal member;

the first power amplifier and the second power amplifier;

a first multiplexer and a second multiplexer; and a third switch including a first antenna connection terminal, a second antenna connection terminal, a first terminal, and a second terminal, wherein the first multiplexer includes the first transmission filter, and a first reception filter having a pass band including a first reception band included in the first frequency band, and does not include a transmission filter having a pass band including the second transmission band, and the second multiplexer includes the second transmission filter, and a second reception filter having a pass band including a second reception band included in the second frequency band, and does not include a transmission filter having a pass band including the first transmission band, and the first terminal is connected to an output terminal of the first transmission filter and an input terminal of the first reception filter, and the second terminal is connected to an output terminal of the second transmission filter and an input terminal of the second reception filter, and in the third switch, conduction between the first antenna connection terminal and the first terminal and conduction between the first antenna connection terminal and the second terminal are exclusively selected, and conduction between the second antenna connection terminal and the first terminal and conduction between the second antenna connection terminal and the second terminal are exclusively selected.

13. The high-frequency module according to claim 12, wherein the first multiplexer further includes a fourth reception filter having a pass band including the second reception band, and the second multiplexer further includes a third reception filter having a pass band including the first reception band.

14. The high-frequency module according to claim 13, wherein two-uplink configured to simultaneously transmit two transmission signals among a transmission signal in the first transmission band, a transmission signal in the second transmission band, and a transmission signal in a third transmission band included in a third frequency band different from the first frequency band and the second frequency band, and two-downlink configured to simultaneously receive two reception signals among a reception signal in the first reception band included in the first frequency band, a reception signal in the second reception band included in the second frequency band, and a reception signal in a third reception band included in the third frequency band are performed, the first multiplexer further includes a fifth transmission filter having a pass band including the third transmission band, and a fifth reception filter having a pass band including the third reception band, and the second multiplexer further includes a sixth transmission filter having a pass band including the third transmission band, and a sixth reception filter having a pass band including the third reception band.

15. A communication device comprising:

the high-frequency module according to claim 12; and an RF signal processing circuit configured to process a high-frequency signal transmitted and received by the high-frequency module.

16. A communication device comprising:

the high-frequency module according to claim 1; and an RF signal processing circuit configured to process a high-frequency signal transmitted and received by the high-frequency module.

* * * * *